United States Patent
Gruner et al.

(10) Patent No.: US 7,405,808 B2
(45) Date of Patent: Jul. 29, 2008

(54) OPTICAL SYSTEM, IN PARTICULAR ILLUMINATION SYSTEM, OF A MICROLITHOGRAPHIC PROJECTION EXPOSURE APPARATUS

(75) Inventors: Toralf Gruner, Aalen-Hofen (DE); Michael Totzeck, Schwaebisch Gmuend (DE); Damian Fiolka, Oberkochen (DE); Wilhelm Ulrich, Aalen (DE); Gerhard Fuerter, Ellwangen (DE)

(73) Assignee: Carl Zeiss SMT AG, Oberkochen (DE)

( * ) Notice: Subject to any disclaimer, the term of this patent is extended or adjusted under 35 U.S.C. 154(b) by 60 days.

(21) Appl. No.: 11/014,199

(22) Filed: Dec. 16, 2004

(65) Prior Publication Data

US 2005/0152046 A1 Jul. 14, 2005

(30) Foreign Application Priority Data

Dec. 19, 2003 (DE) .................. 103 59 849

(51) Int. Cl.
*G03B 27/54* (2006.01)
*G03B 27/42* (2006.01)
*G02B 5/08* (2006.01)

(52) U.S. Cl. ............................ 355/67; 355/53; 359/857
(58) Field of Classification Search ............ 355/53, 355/67, 77; 359/485, 494, 495, 496, 850, 359/857
See application file for complete search history.

(56) References Cited

U.S. PATENT DOCUMENTS

| 4,856,019 | A | | 8/1989 | Miyata et al. |
| 5,048,926 | A | * | 9/1991 | Tanimoto ..................... 359/487 |
| 5,153,773 | A | * | 10/1992 | Muraki et al. ................ 359/619 |
| 5,729,337 | A | * | 3/1998 | Tanaka et al. ................. 355/53 |
| 5,850,309 | A | | 12/1998 | Shirai et al. |
| 6,229,647 | B1 | * | 5/2001 | Takahashi et al. ........... 359/487 |
| 2001/0052968 | A1 | * | 12/2001 | Shiozawa .................... 355/53 |

FOREIGN PATENT DOCUMENTS

DE 102 29 614 6/2002

OTHER PUBLICATIONS

Roger Rymps, article entitled "Diagnostic Laser Beam Measurement," Photonics Spectra, published Nov. 2003, pp. 50-53.

* cited by examiner

*Primary Examiner*—Alan A Mathews
(74) *Attorney, Agent, or Firm*—Factor & Lake, Ltd.

(57) ABSTRACT

An optical system, particularly an illumination system, of a microlithographic projection exposure apparatus contains at least one plane reflecting surface for folding the beam path. The at least one reflecting surface is arranged with respect to an optical axis of the optical system such that the intensity ratio between two mutually perpendicular polarization directions is at least substantially preserved for an axially parallel light ray deviated by the at least one reflecting surface. In accordance with a second aspect, the at least one reflecting surface is arranged such that a maximum effect on the polarization of the projection light is achieved, so as to be able to compensate for polarization dependencies which occur in other components of the illumination system.

13 Claims, 4 Drawing Sheets

OPTICAL SYSTEM, IN PARTICULAR ILLUMINATION SYSTEM, OF A MICROLITHOGRAPHIC PROJECTION EXPOSURE APPARATUS

CROSS-REFERENCE TO RELATED APPLICATIONS

This application claims priority of German Patent Application DE 103 59 849.9, filed Dec. 19, 2003. The full disclosure of this application is incorporated herein by reference.

BACKGROUND OF THE INVENTION

1. Field of the Invention

The invention relates to an optical system for microlithographic projection exposure apparatuses, such as are used for the production of large-scale integrated electrical circuits and other microstructured components. The invention relates in particular to illumination systems having a plurality of reflecting surfaces for folding the beam path.

2. Description of Related Art

Integrated electrical circuits and other microstructured components are conventionally produced by applying a plurality of structured layers to a suitable substrate which, for example, may be a silicon wafer. In order to structure the layers, they are first covered with a photoresist which is sensitive to a light of a particular wavelength range, for example light in the deep ultra-violet (DUV) spectral range. The wafer coated in this way is subsequently exposed in a projection exposure apparatus. A pattern of diffracting structures, which is arranged on a mask, is thereby projected onto the photoresist with the aid of a projection lens. Since the projection scale is generally less than 1, such projection lenses are often also referred to as reduction objectives.

The performance of such projection exposure apparatuses is determined not only by the imaging properties of the projection lens, but also by the properties of an illumination system which precedes the projection lens. Its object is to generate a projection light beam, which is directed at the mask to be projected. For this purpose the illumination system contains a light source, for example a pulse-operated laser, and a plurality of optical elements which generate a projection light beam with the intended properties from the light provided by the light source. These properties include, for example, the intensity and illumination-angle distributions over the cross section of the projection light beam, that is to say the angular distribution of the light rays which form the projection light beam.

Increasing importance is being attached to the polarization distribution of the projection light beam generated by the illumination system, since it has proved expedient for the projection light generated by the illumination system to arrive at the mask with a polarization state which is defined as accurately as possible. For example, it may be desirable for the projection light arriving at the mask to be linearly polarized substantially or fully in a given direction. Beam-splitter layers, which are often contained in catadioptric projection lenses, can achieve very high efficiencies with linearly polarized light in a suitable way. It may, however, be also desirable to direct substantially unpolarized or circularly polarized projection light onto the mask. For example, this can prevent or at least reduce resolution differences which depend on the direction of the structures contained in the mask.

The simplest situation is when the illumination system is intended to generate linearly polarized light, since the lasers conventionally used as light sources emit linearly polarized light. However, the subsequent optical elements can undesirably affect the polarization state of the projection light. If a rod homogenizer is being used for mixing the light, for example, then it is relatively difficult to control the polarization state of the projection light passing through. This is associated inter alia with the fact that skewed total reflections take place at the lateral interfaces of the rod homogenizer, and these change the polarization state by their phase-shifting effect. An undesirable effect on the polarization state can also be caused by diffractive optical elements with a polarization-dependent diffraction efficiency, or by optical elements which have an intrinsic or induced birefringence. The reflectivity of deviating mirrors, which may be arranged in illumination systems in order to fold the beam path, is also polarization-dependent.

Since the projection light is generally intended to arrive not only with an intended polarization at the mask but also with a defined polarization at the photoresist, attempts have also been made in the past to use measures inside the projection lens so as to affect the polarization of the projection light passing through. The context for this, inter alia, is that the projection lenses may also include optical elements which undesirably affect the polarization state of the projection light.

SUMMARY OF THE INVENTION

It is an object of the invention to be able to improve the control over the polarization of projection light in projection exposure apparatuses and, in particular, in their illumination system.

In accordance with a first aspect of the invention, this object is achieved in that the optical system has at least one plane reflecting surface for folding the beam path, which is arranged with respect to an optical axis of the optical system so that the intensity ratio between two mutually perpendicular polarization directions is at least substantially preserved for an axially parallel light ray deviated by the at least one reflecting surface.

The invention in accordance with this first aspect is based on the fact that although the reflectivity at reflecting surfaces is polarization-dependent, an expediently selected arrangement of one or more such surfaces can nevertheless be used to reduce or even fully eliminate this polarization dependency of the reflectivity. The cost of this is at worst a common rotation of the polarization directions, but with the intensity ratio between two mutually perpendicular polarization directions still being preserved. Such rotations are generally not a problem since, if need be, they can be made reversible in a comparatively straightforward way.

The reflecting surfaces may be any interfaces between materials with different optical densities. Relevant examples of this include glass supports coated with layer systems, which are arranged in air, a vacuum or a protective gas atmosphere, and prisms in which the individual surfaces are provided with reflective coatings.

The simplest way of reducing the polarization dependency is to arrange the at least one reflecting surface so that its normal makes an angle of less than 40°, preferably less than 30°, more preferably approximately 22.5° with the optical axis. This exploits the fact that the reflectivity of reflecting surfaces does not become polarization-dependent until fairly large angles of incidence. In the illumination systems and projection lenses known to date, the normals of the deviating mirrors are in general arranged so that they are inclined by 45° with respect to the optical axis. Axially parallel light rays therefore strike the deviating mirrors at angles for which the reflectivity already has a significant polarization dependency. But if the angle between the normal of the reflecting surface and the optical axis is much less than 45°, then the reflectivity is substantially polarization-independent for most materials which are used for the production of reflecting surfaces.

For design reasons, however, it is often desirable to fold the beam path through 90°. In one advantageous configuration of the invention, therefore, two reflecting surfaces are provided for deviating the optical axis by a total of 90°, and their normals make an angle of approximately 22.5° with the optical axes respectively before and after the deviation, and an angle of approximately 135° between each other. Such an arrangement of reflecting surfaces ensures that the optical axis is deviated by a total of 90° but that axially parallel rays strike the reflecting surfaces merely at an angle of 22.50, so that they are substantially reflected polarization-independently by the arrangement.

Another way of folding the beam path by means of reflecting surfaces, but without affecting the intensity ratio of mutually perpendicular polarization directions, is for an optical element, which exchanges the polarization directions of s-polarized and p-polarized light, to be arranged between two reflecting surfaces for deviating the optical axes, the normals of which preferably make the same angle with the optical axes before and after the deviation.

Owing to the optical element arranged between the reflecting surfaces, which may for example be a half-wave plate or a combination of several individual retardation plates, the polarization direction of light which is polarized parallel to the incidence plane when it strikes the first reflecting surface is converted into its mirror image through the retardation axis. When it arrives at the second reflecting surface, therefore, the light is no longer polarized parallel but perpendicularly to the incidence plane. The same applies for the polarization direction perpendicular to it.

In this way, a polarization state change which is experienced by light when it is reflected by the first reflecting surface will be compensated for when it is reflected by the second reflecting surface. This compensation will be commensurately more complete when there is a better match of the angles between the normals of the reflecting surfaces and the optical axes, before and after the deviation. With exactly equal angles, the intensity ratio between the polarization directions will remain unchanged even though the polarization directions have been rotated overall. Since the aforementioned compensation effect does not depend on the value of the angle, this configuration of the invention can advantageously be used even when rays strike the reflecting surfaces at fairly large angles of incidence.

Another way of deviating the optical axis while preserving the intensity ratio of mutually perpendicular polarization directions is for the normals of two reflecting surfaces to be arranged with respect to the optical axes before and after the deviation so that the incidence planes relating to the two surfaces are mutually perpendicular. With mutually perpendicular incidence planes, the aforementioned "exchange" of the light components polarized parallel and perpendicularly to the incidence plane takes place even without the polarization directions being rotated with the aid of an extra optical element. For laser beam measurements, such an arrangement of two reflecting surfaces has already been disclosed in the article by R. Rypma entitled "Diagnostic Laser Beam Measurement", Photonics Spectra, November 2003, pages 50 to 54.

For example, perpendicular incidence planes can be produced by an arrangement of two reflecting surfaces whose normals make an angle of approximately 45° with the optical axes respectively before and after the deviation, and an angle of approximately 60° between each other. The reflecting surfaces are then arranged in the same way as the reflecting surfaces in a Nachet prism. Of course, these two reflecting surfaces may in fact be the suitably coated reflecting surfaces of a Nachet prism.

Another way of achieving polarization-neutral folding of the beam path by two reflecting surfaces is to provide two reflecting surfaces in order to deviate the optical axis, one of the surfaces having a reflectivity for light polarized perpendicularly to an incidence plane with incidence angles of more than 30° which is greater than the reflectivity for light polarized parallel to the incidence plane, and the other surface having a reflectivity for light polarized perpendicularly to an incidence plane with incidence angles of more than 30° which is less than the reflectivity for light polarized parallel to the incidence plane.

This configuration is based on the fact that reflecting surfaces have now been developed in which the per se known polarization dependency of the reflectivity is reversed, so that at fairly large angles it is not the polarization component perpendicular to the incidence plane which is reflected more strongly, but the polarization component perpendicular to it. By using a combination of one reflecting surface with a conventional polarization dependency and another reflecting surface with the reverse polarization dependency, it is thus possible to achieve mutual compensation of the polarization dependencies. Since the angular dependency of the reflectivity may not be the same for different polarization components at the two reflecting surfaces, the two reflecting surfaces need not necessarily be arranged at equal angles with respect to the optical axes before and after the deviation.

In accordance with a second aspect of the invention, the reflecting surfaces for folding the beam path are not intended to be as polarization-neutral as possible overall, but instead are intended to have a maximum effect on the polarization of the projection light, so as to be able to compensate for polarization dependencies which occur in other components of the illumination system.

In accordance with the invention, the object mentioned in the introduction is achieved in accordance with the second aspect in that the normal of the at least one reflecting surface in an illumination system makes an angle of more than 50°, preferably more than 60°, more preferably approximately 67.5° with the optical axis.

This exploits the fact that the polarization dependency of reflecting surfaces becomes significantly greater as the angles of incidence increase. If the normal of the reflecting surface is arranged at the Brewster angle with respect to the optical axis, for example, then only the polarization component perpendicular to the incidence plane will still be reflected by conventional materials in the case of axially parallel rays. If a plurality of reflecting surfaces are arranged with respect to the optical axis so that the normal to the surfaces makes fairly large angles with the optical axes, then a strong polarizing effect can be achieved even with deviations from the Brewster angle.

If the optical axis is intended to be deviated by a total of 90°, then the normals of two reflecting surfaces provided for the deviation may make an angle of approximately 67.5° with the optical axes respectively before and after the deviation, and an angle of approximately 45° between each other. This provides an arrangement in which a deviation of the optical axis by a total of 90° is achieved with two reflecting surfaces and, at the same time, a strong polarizing effect is also achieved.

The solutions and configurations mentioned above in connection with the second aspect of the invention can moreover be used advantageously not only in illumination systems, but also in projection lenses.

Another way of increasing the polarization dependency of a reflecting surface for folding the beam path is to configure the reflecting surface as a polarization-selectively reflective layer arrangement. Such layer arrangements, which are also referred to as s-p layers, are often used for example as polarization-selective beam-splitter layers in catadioptric projection lenses, and are known as such in the prior art. However, the use of such layer arrangements in order to set an intended polarization state in illumination systems has never previously been proposed.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
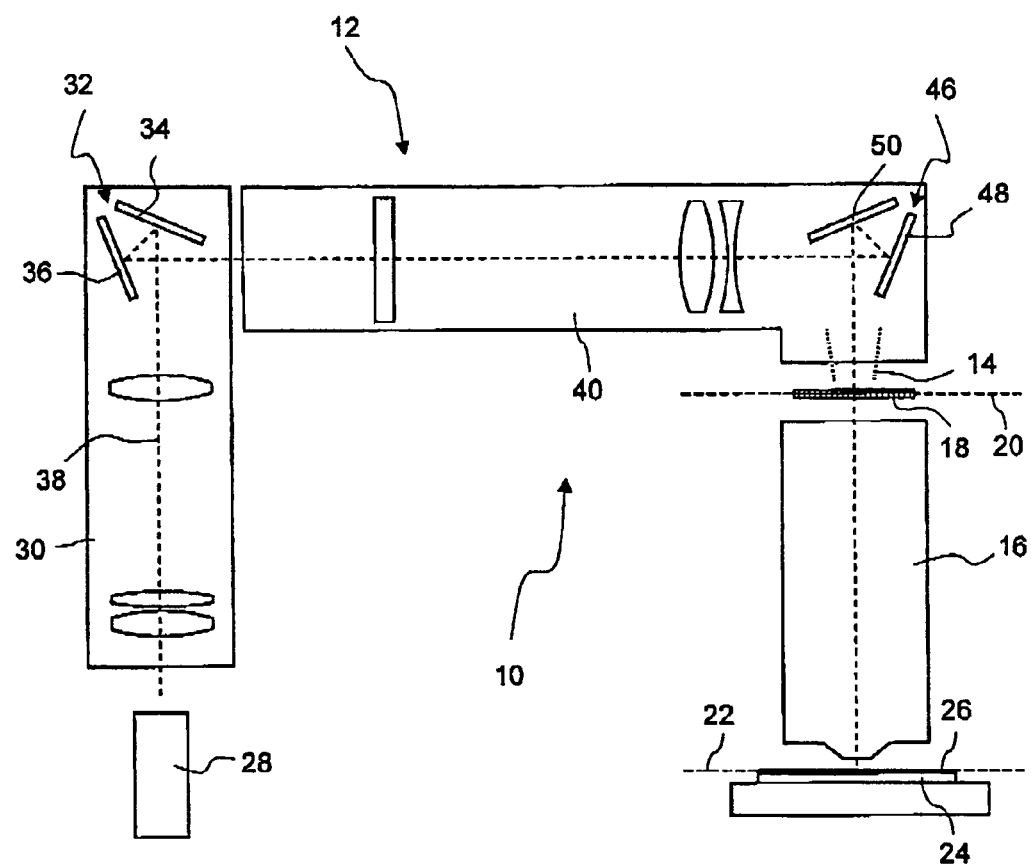
FIG. 1 shows a projection exposure apparatus having an illumination system in accordance with the invention, in a highly simplified meridian section.

FIG. 1 shows a section through a projection exposure apparatus denoted overall by 10, in a highly simplified representation which is not true to scale. The projection exposure apparatus 10 has an illumination system 12, which comprises a plurality of modules and is used for the generation of a projection light beam 14, here indicated only at the output of the illumination system 12. Between the illumination system 12 and a projection lens 16 of the projection exposure apparatus 10, a reticle 18 is arranged so that it can be displaced in an object plane 20 of the projection lens 16.

The projection lens 16 is used to project a reduced image of structures which are arranged on the reticle 18, and through which the projection light beam 14 passes, into an image plane 22 of the projection lens 16. A photosensitive layer 26, which may for example be a photoresist, is applied to a wafer 24 in the image plane 22.

Besides a light source 28 configured as a laser, the illumination system 12 comprises a first module 30 having a plurality of optical elements, which are represented merely for example by lens elements (not described in detail). Since the functions of these elements are not relevant in this context, further details will not be explained in respect of them. On its other side from the light source 28, the module 30 furthermore comprises first deviating optics, which are denoted overall by 32 and are used for folding the beam path. The first deviating optics 32 contain two plane mirrors 34 and 36 and deviate an optical axis of the first module 30, indicated by 38, through 90°.

After the deviation, the projection light enters a second module 40, which likewise contains a plurality of optical elements (not described in detail) and second deviating optics 46. The second deviating optics 46 are constructed in the same way as the first deviating optics 32, and comprise two plane mirrors 48, 50.

Figure 2:
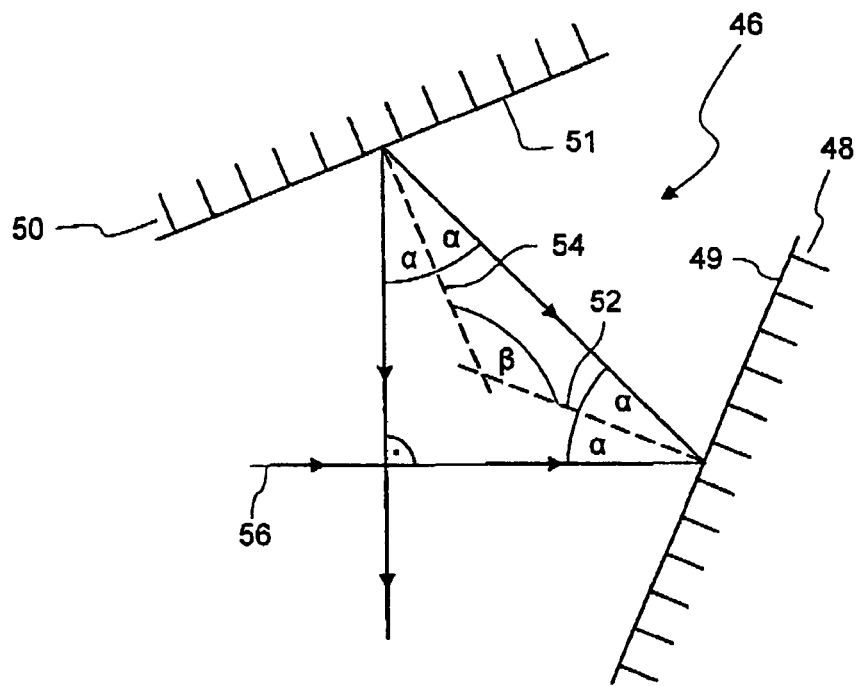
FIG. 2 shows deviating optics as shown in FIG. 1 for folding the beam path through 90°, in an enlarged representation in accordance with a first embodiment of the invention.

FIG. 2 shows the second deviating optics 46 in an enlarged representation. The two plane mirrors 48, 50 each have a support with a plane surface, which is provided with a coating that has a high reflectivity for the projection light generated by the light source 28. Coatings of this type are known per se in the prior art, cf. for instance U.S. Pat. No. 4,856,019 or U.S. Pat. No. 5,850,309, so that further details need not be explained in respect of them. The reflective coatings of the plane mirrors 48, 50 have the property that the reflectivity for light which arrives at the plane mirrors 48, 50 with fairly large angles of incidence depends on the polarization direction of the incident light. In the embodiment which is represented, the plane mirrors 48, 50 are "normal" mirrors in so far as the reflectivity for the polarization component lying in the incidence plane is less than for the polarization component perpendicular to the incidence plane. These two polarization components will be referred to below as the p-component and the s-component for brevity. Also suitable, however, are the mirrors explained below with reference to FIG. 5, with which the reflectivity for the p-component is not less but greater than for the s-component in the case of fairly large angles of incidence.

The reflecting surfaces 49, 51 formed by the coatings of the plane mirrors 48, 50 are mutually arranged so that their respective perpendicular normals 52 and 54 make an angle $\beta=135°$ between each other. The plane mirrors 48, 50 are furthermore arranged in the beam path so that the normals 52, 54 make an angle $\alpha=22.5°$ with the optical axes respectively before and after the deviation. Instead of the optical axis, FIG. 2 shows an axially parallel ray 56 for which this relationship naturally applies in the same way.

Owing to the aforementioned arrangement of the plane mirrors 48, 50, the ray 56 is reflected by the two plane mirrors 48, 50 so that it is deviated by a total of 90°. Owing to the small angle of incidence $\alpha=22.5°$ with which the axially parallel ray 56 arrives at the reflecting surfaces 49, 51 of the plane mirrors 48, 50, the aforementioned polarization dependency of the reflectivity does not yet significantly occur. The second deviating optics 46 are therefore polarization-neutral overall for axially parallel rays, in so far as the intensity ratio of two mutually perpendicular polarization components is substantially unaffected by the deviation in the second deviating optics 46.

For rays which do not arrive axially parallel at the first reflecting surface 49, angles of incidence greater or less than 22.5° can occur. For these comparatively small angles of incidence, since the polarization dependency of the reflectivity is still only weakly dependent on the angle of incidence, the polarization-neutral effect of the second deviating optics 46 is substantially preserved at least for beams of rays with fairly small aperture angles.

Since the first deviating optics 32 are constructed in the same way as the aforementioned second deviating optics 46, the polarization state of projection light passing through will be substantially unaffected by the deviating optics 32, 46. If the polarization state is also unaffected by the other optical elements arranged in the illumination system 12, then the polarization state generated by the light source 28 will be preserved overall. If the light source 28 is a laser generating linearly polarized light, for example, than the projection light beam 14 arriving at the reticle 18 will likewise be polarized linearly, irrespective of the direction of the polarization.

Figure 3:
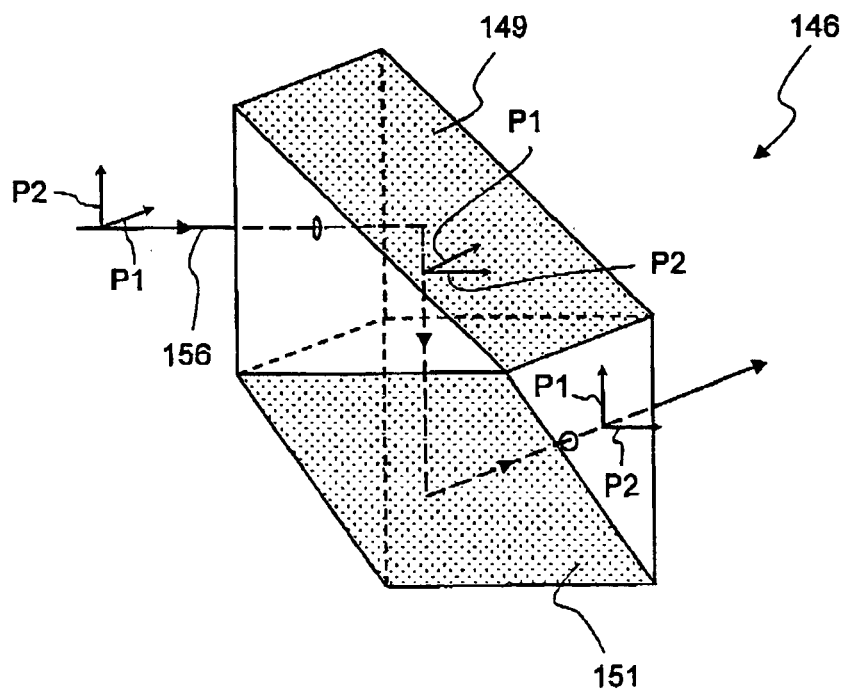
FIG. 3 shows deviating optics in accordance with a second embodiment of the invention, configured as a Nachet prism.

FIG. 3 represents the second deviating optics in accordance with a second embodiment, in perspective. The second deviating optics are configured here as a Nachet prism 146. For the sake of clarity, the Nachet prism 146 in FIG. 3 is rotated so that an axially parallel ray 156 arriving from the left-hand side does not leave the Nachet prism 146 downwards but into the plane of the paper. By rotating the Nachet prism 146 by 90° about a horizontal axis, the ray 156 can be deviated in the same direction as that represented in FIG. 2.

The Nachet prism 146 contains a first reflecting surface 149 and a second reflecting surface 151, which are formed by suitable coatings and the normals of which make an angle of 60° between each other. The reflecting surfaces 149, 151 are furthermore mutually arranged so that the axially parallel incident light ray 156 arrives with an angle of incidence of 45° at the first reflecting surface 149, and subsequently arrives at the second reflecting surface 151 likewise with an angle of incidence of 45°. The incidence planes relating to the reflecting surfaces 149, 151 are mutually perpendicular owing to the skewed arrangement of the reflecting surfaces 149, 151.

In FIG. 3, two mutually perpendicular polarization states of the ray 156 are indicated by P1 and P2. When arriving at the first reflective layer 149, the polarization component P1 corresponds to the s-component and the polarization component P2 corresponds to the p-component. Since the incidence plane during the subsequent reflection by the second reflective layer 151 is perpendicular to the incidence plane relating to the reflection by the first reflective layer 149, the two polarization components P1 and P2 exchange their roles in the Nachet prism 146. After the reflection by the first reflective layer 149, therefore, the polarization component P1 is the p-component and the polarization component P2 is the s-component for the reflection by the second reflective layer 151.

Owing to this exchange of the s-component and the p-component, any change in the intensity ratio between the two polarization components P1 and P2 due to the polarization-dependent reflectivity of the first reflective layer 149 is compensated for by the reflection at the second reflective layer 151. The intensity ratio of the polarization components P1, P2 is thus preserved when the ray 156 passes through the Nachet prism 146. After leaving the Nachet prism 146, the polarization directions of the two polarization components P1 and P2 have been slightly rotated overall.

Figure 4:
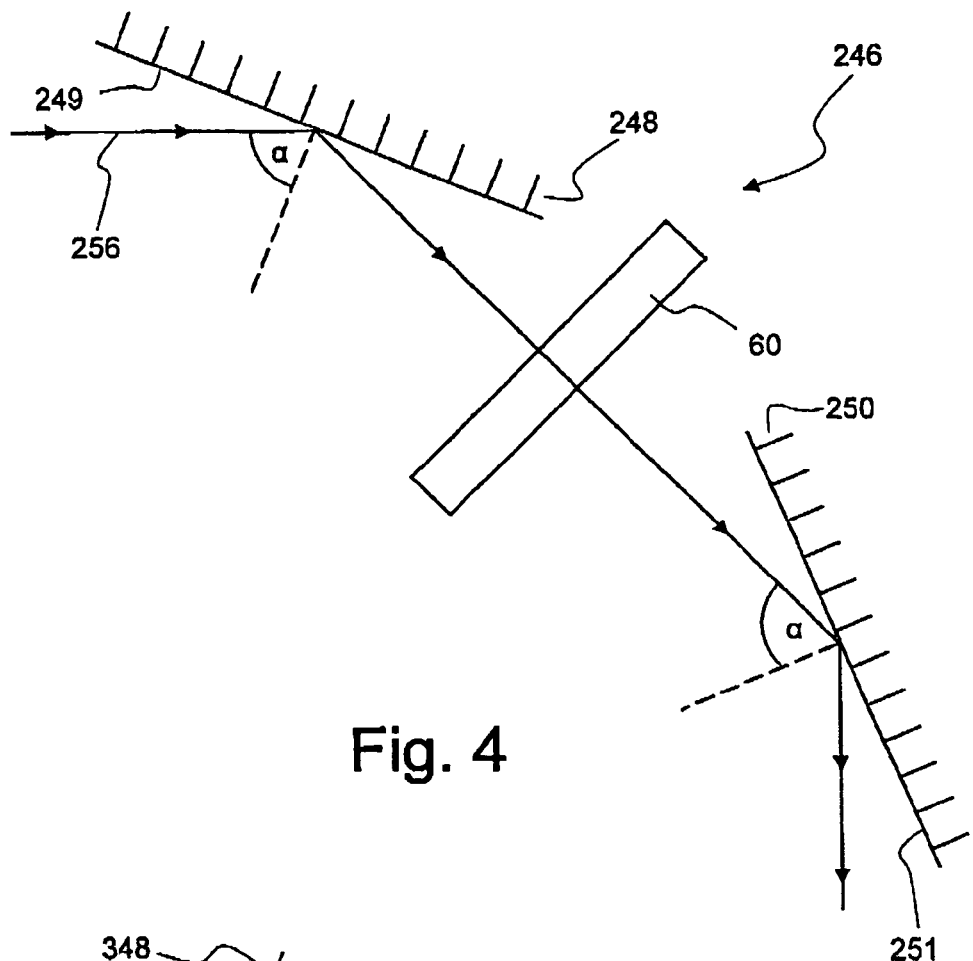
FIG. 4 shows deviating optics for folding the beam path through 90° in accordance with a third embodiment of the invention.

FIG. 4 shows second deviating optics, denoted overall by 246, in accordance with a third embodiment in a similar representation to FIG. 2. A first plane mirror 248 and a second plane mirror 250 are mutually arranged in the deviating optics 246 so that an incident axially parallel light ray 256 arrives with a relatively large angle of incidence a at a reflecting surface 249 of the first plane mirror 248. The second plane mirror 250 is aligned so that the ray reflected by the first plane mirror 248 arrives with approximately the same angle of incidence a at its reflecting surface 251.

Between the two plane mirrors 248, 250, a half-wave plate 60 is arranged so that the polarization directions of light passing through are rotated by 90°. In this way, a similar effect is achieved as with the Nachet prism 146. Specifically, the s-component and the p-component of the ray 256 exchange their roles when passing through the half-wave plate 60, so that the polarization component which was reflected less well by the reflecting surface 249 of the first plane mirror 248, for example, will be reflected more strongly by the reflecting surface 251 of the second plane mirror 250 than the polarization component perpendicular to it. The second deviating optics 246 therefore also lead to an overall rotation of the polarization directions, but with the intensity ratio between two mutually perpendicular polarization directions still being kept substantially unchanged in the deviating optics 246.

Figure 5:
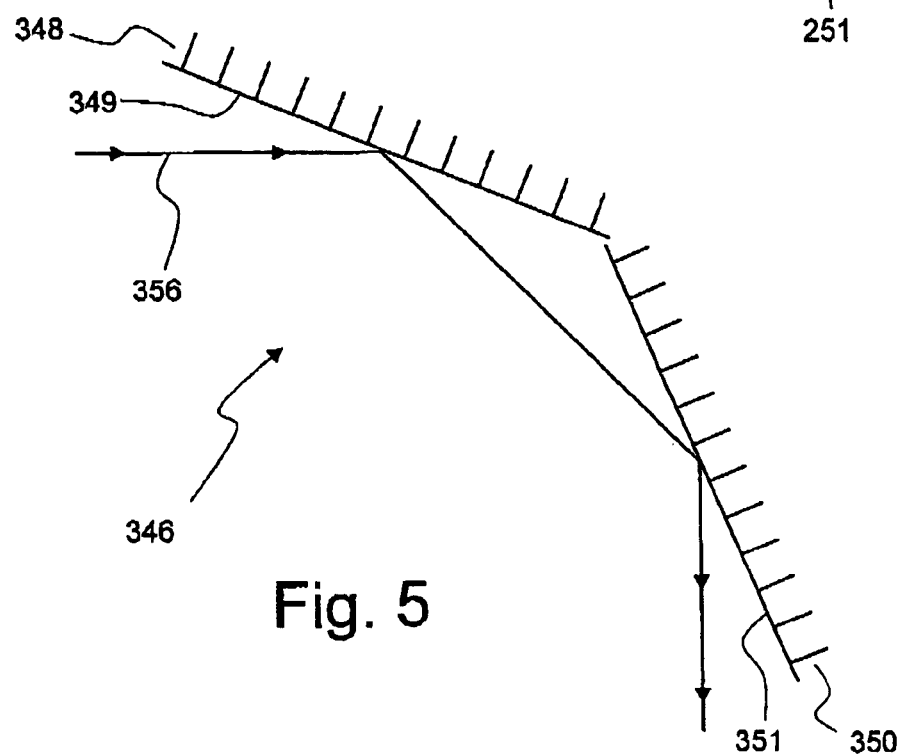
FIG. 5 shows deviating optics for folding the beam path through 90° in accordance with a fourth embodiment of the invention.

FIG. 5 shows second deviating optics, denoted overall by 346, in accordance with a third embodiment in a similar representation to FIG. 4. The second deviating optics 346 differ from the deviating optics 246 as shown in FIG. 4, on the one hand, in that there is no half-wave plate 60. On the other hand, the coating of the second mirror 350 is configured so that it has a reverse polarization dependency of the reflectivity compared with conventional coatings. Such a coating may, for example, consist of an aluminum layer with a layer thickness of from 65 nm to 100 nm, preferably 80 nm, and a layer of silicon oxide with a layer thickness of about 15 nm applied on top. Such coatings are described in more detail in DE 102 40 598 A, for example, the disclosure of which is fully incorporated here by reference.

The reflecting surface 351 of the second mirror 350 therefore has the property that, for fairly large angles, it is the p-component rather than the s-component of the incident ray 356 which is reflected more strongly. Combination of the reflecting surface 349 with a conventional polarization dependency and the reflecting surface 351 with the reverse polarization dependency provides mutual compensation of the polarization dependencies. If the angular dependency of the reflectivity for different polarization components is not the same at the two reflecting surfaces 349, 351 then, in order to achieve maximum compensation, it is expedient for the two reflecting surfaces 349, 351 to be arranged at different angles with respect to the optical axes before and after the deviation, rather than at the same angle as represented in FIG. 5.

Since the order of the reflections is not relevant to the aforementioned compensation effect, the two plane mirrors 248, 250 may of course have their coatings exchanged.

Figure 6:
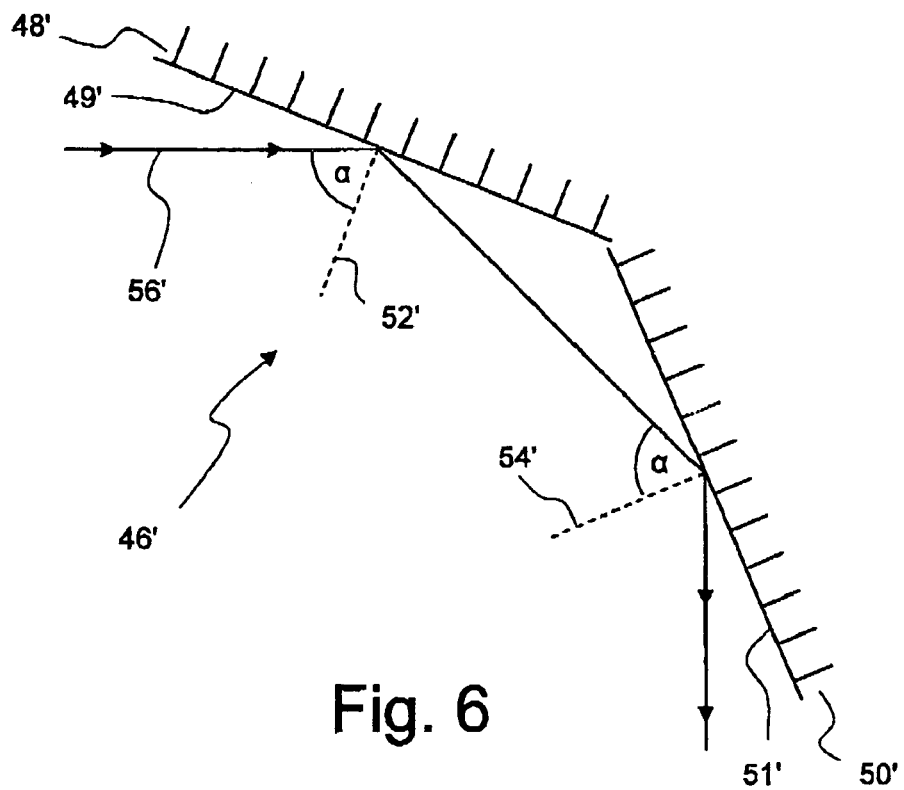
FIG. 6 shows deviating optics for folding the beam path through 90° in accordance with a second aspect of the invention, which have a particularly strong polarizing effect.

FIG. 6 shows second deviating optics 46' which substantially correspond to the deviating optics 346 in FIG. 5. The two reflecting surfaces 49', 51' of the mirrors 48', 50', however, consist of the same coating and therefore have the same polarization dependency of the reflectivity. In this way, the polarization dependencies of the two plane mirrors 48', 50' reinforce each other. In the embodiment which is represented, the polarization dependencies are in fact particularly large, since the normals 52', 54' of the plane mirrors 48', 50' make an angle of 67.5° with the optical axes respectively before and after the deviation, so that the axially parallel ray 56' arrives with a large angle of incidence at the reflecting surfaces 49', 51'. The deviating mirror 46' therefore has a large overall polarizing effect, which becomes commensurately greater as the angle of incidence approaches the Brewster angle for the coating in question.

The deviating mirror 46' may, for example, be used when a rod homogenizer for mixing the light is arranged in the second module 40 of the illumination system 12. Since the light emerging from a rod homogenizer is substantially unpolarized, a substantially linear polarization state can be produced by deviating optics which polarize strongly, such as those shown in FIG. 6.

Figure 7:
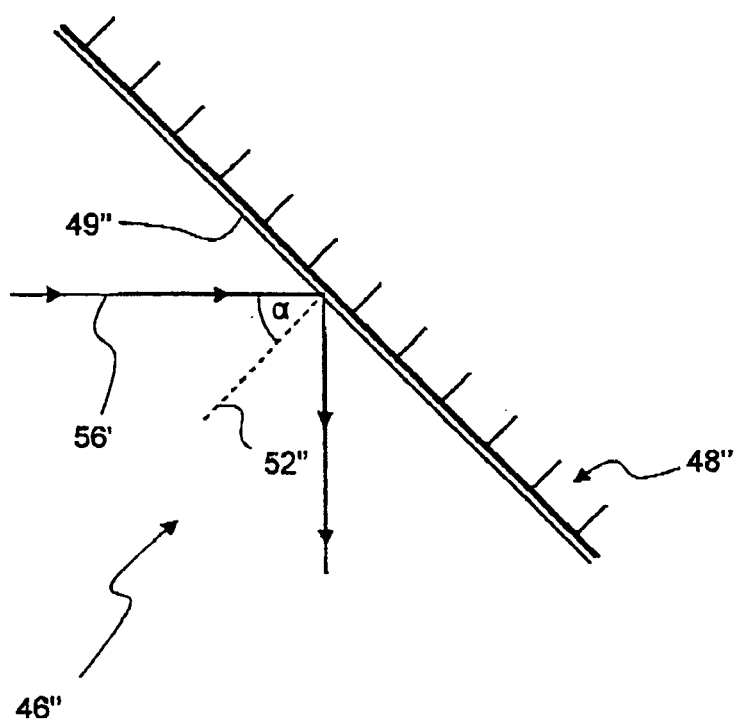
FIG. 7 shows deviating optics for folding the beam path in an illumination system having a polarization-selectively reflective layer arrangement in accordance with the second aspect of the invention.

FIG. 7 shows second deviating optics 46" which differ from the deviating optics above, inter alia, in that they comprise only a single plane mirror 48". A reflecting surface 49"

of the plane mirror 48" is formed by a polarization-selectively reflective layer arrangement such as is known from the prior art, for instance in connection with beam splitters of catadioptric projection lenses. Such a layer arrangement has the property that the reflectivities for the s-component and the p-component differ significantly. For example, more than 90% of the s-component of the projection light is reflected whereas less than 5% of the p-component is reflected, and most of the remainder is transmitted by the layer arrangement.

This significant polarization dependency of the reflectivity, however, is generally not independent of the angle of incidence. In order to achieve a particularly strong polarizing effect, it may therefore be expedient either to configure the layer arrangement with a view to the intended folding angle or to adapt this folding angle to the layer arrangement. Yet in most cases, a strong polarizing effect will be obtained even if the normal 52" of the reflecting surface 49" is arranged at an angle α=45° with respect to the optical axis of the illumination system, as in the embodiment represented in FIG. 7. An incident axially parallel ray 56" will therefore be deviated by 90° with a single mirror 48", while being substantially linearly polarized.

What is claimed is:

1. An optical system of a microlithographic projection exposure apparatus, having:
   a) an optical axis and
   b) a mirror device that
      i) deviates the optical axis and
      ii) comprises at least two plane non-transparent reflecting surfaces that are arranged with respect to the optical axis such that every possible intensity ratio between two mutually perpendicular polarization directions is at least substantially preserved for every light ray that runs parallel to the optical axis.

2. The optical system of claim 1, wherein the normal of the at least one reflecting surface makes an angle of less than 40° with the optical axis.

3. The optical system of claim 2, wherein the normal of the at least one reflecting surface makes an angle of less than 30° with the optical axis.

4. The optical system of claim 3, wherein the normal of the at least one reflecting surface makes an angle of at least substantially 22.5° with the optical axis.

5. The optical system of claim 4, wherein the optical axis is deviated by 90° and the mirror device comprises two plane reflecting surfaces having normals that both make an angle of approximately 22.5° with the optical axis and an angle of approximately 135° between each other.

6. The optical system of claim 1, wherein an angle between the optical axis and each normal of the at least two plane non-transparent reflecting surfaces is the same, and wherein the mirror device further includes an optical element, which exchanges the polarization directions of s-polarized and p-polarized light and is arranged between the at least two plane non-transparent reflecting surfaces.

7. The optical system of claim 1, wherein the mirror device comprises two reflecting surfaces having normals that are arranged with respect to the optical axis such that the incidence planes for coaxial rays are perpendicular to each other.

8. The optical system of claim 7, wherein the optical axis is deviated by 90°, and wherein the normals of the two reflecting surfaces make an angle of approximately 45° with the optical axis and an angle of approximately 60° between each other.

9. The optical system of claim 8, wherein the two reflecting surfaces are the reflecting surfaces of a Nachet prism.

10. The optical system of claim 1, comprising a light source for illuminating a structure.

11. The optical system of claim 1, wherein the mirror device comprises:
    a) a first plane reflecting surface having, for incidence angles of more than 30°, a reflectivity for light polarized perpendicularly to an incidence plane which is greater than the reflectivity for light polarized parallel to the incidence plane, and
    b) a second plane reflecting surface having, for incidence angles of more than 30°, a reflectivity for light polarized perpendicularly to an incidence plane which is less than the reflectivity for light polarized parallel to the incidence plane.

12. A microlithographic projection exposure apparatus comprising an optical system of claim 1.

13. A method for the microlithographic production of microstructured components, comprising the following steps:
    a) providing a support, on which a layer of a photosensitive material is at least partially applied;
    b) providing a reticle, which contains structures to be projected;
    c) providing an illumination system for the generation of projection light according to claim 1;
    d) projecting at least a part of the reticle onto a region on the layer with the aid of a projection lens.

* * * * *